United States Patent
Shao et al.

[19]

[11] Patent Number: 6,124,194
[45] Date of Patent: Sep. 26, 2000

[54] METHOD OF FABRICATION OF ANTI-FUSE INTEGRATED WITH DUAL DAMASCENE PROCESS

[75] Inventors: Kai Shao; Yi Xu; Cerdin Lee; Shao-Fu Sanford Chu, all of Singapore, Singapore

[73] Assignee: Chartered Semiconductor Manufacturing Ltd., Singapore, Singapore

[21] Appl. No.: 09/439,365

[22] Filed: Nov. 15, 1999

[51] Int. Cl.$^7$ ...................................................... H07L 29/00
[52] U.S. Cl. ........................... 438/600; 438/132; 438/215; 438/281; 438/601; 438/622; 438/624; 438/637; 438/675; 257/529; 257/530
[58] Field of Search .................................... 438/132, 215, 438/281, 600, 601, 622, 624, 637, 675; 257/529, 530

[56] References Cited

U.S. PATENT DOCUMENTS

| | | | |
|---|---|---|---|
| 5,602,053 | 2/1997 | Zheng et al. | 437/60 |
| 5,705,849 | 1/1998 | Zheng et al. | 257/530 |
| 5,741,626 | 4/1998 | Jain et al. | 430/314 |
| 5,877,075 | 3/1999 | Dai et al. | 438/597 |

*Primary Examiner*—Charles Bowers
*Assistant Examiner*—Lisa Kilday
*Attorney, Agent, or Firm*—George O. Saile; Rosemary L. S. Pike; Stephen G. Stanton

[57] ABSTRACT

A method of fabricating an anti-fuse module and dual damascene interconnect structure comprises the following steps. A semiconductor structure having at least two exposed metal lines covered by a first dielectric layer is provided. A first metal line is within an anti-fuse area and a second metal line is within an interconnect area. A first metal via is formed within the first dielectric layer within the anti-fuse area with the first metal via contacting the first metal line. A SiN layer is deposited over the first dielectric layer and the first metal via. The SiN layer is patterned to form at least two openings. A first opening exposes the first metal via, and a second opening exposes a portion of the first dielectric layer above the second metal line. A fusing element layer is deposited and patterned over the patterned SiN layered structure to form a fusing element over the first metal via. Simultaneously, an anti-fuse metal line is formed over the fusing element to form an anti-fuse module within the anti-fuse area, and a dual damascene interconnect is formed over, and contacting with, the second metal line and within the interconnect area.

13 Claims, 4 Drawing Sheets

METHOD OF FABRICATION OF ANTI-FUSE INTEGRATED WITH DUAL DAMASCENE PROCESS

BACKGROUND OF THE INVENTION

Anti-fuse devices permit connecting underlying semiconductor devices otherwise isolated by rupturing, or converting to a lower resistance layer, an overlying fusing element by a high voltage electrical pulse. This permits connection of the underlying semiconductor device(s) with a predetermined circuit within the integrated circuit chip through a wire line overlying the fusing element. Anti-fuse modules may be used, for example, to compensate for defective devices elsewhere on the chip discovered during testing of the chip (wafer sort) by permitting access to underlying back-up semiconductor devices.

For example, field-programmable gate arrays, (FPGA) have been designed to contain the needed row of arrays, as well as additional rows of spare arrays, accessed if needed to replace ineffective counterparts, or to modify a specific design. These additional or spare arrays, or one-time fusible link structures, are sometimes comprised of an antifuse based programmable interconnect structure. The structure consists of an antifuse layer, usually a thin dielectric layer, placed between electrodes or conductive materials. When needed this antifuse material can be ruptured, or converted to a lower resistance layer, via a high voltage electrical pulse, resulting in creation of the replacement array structure.

Anti-fuse modules are fabricated along with other devices on the semiconductor chip. A prior art method of fabricating an anti-fuse module along with a normal device, such as a copper (Cu) dual damascene interconnect, required etching the antifuse stack over the normal device area which could damage the via portion of the normal device.

U.S. Pat. No. 5,877,075 to Dai, Jr. et al. describes a method of forming a dual damascene pattern employing a single photoresist layer.

U.S. Pat. No. 5,741,26 to Jain et al. describes a method for forming a dual damascene structure using an anti-reflective coating (ARC) layer of dielectric tantalum nitride ($Ta_3N_5$) to reduce the amount of reflectance from the underlying conductive region and thus reduce the distortion of the photoresist pattern.

U.S. Pat. Nos. 5,705,849 and 5,602,053, both to Zheng et al. describe an anti-fuse structure and the method of making it, respectively. The anti-fuse structure comprises two dual damascene connectors separated by a structure comprising a pair of alternating layers of silicon nitride and amorphous silicon.

SUMMARY OF THE INVENTION

Accordingly, it is an object of the present invention to provide a method of forming an anti-fuse module compatible with a Cu dual damascene process.

Another object of the present invention is to provide a method of integrally forming an anti-fuse module with a dual damascene process without impacting on the baseline of that dual damascene process.

Yet another object of the present invention is to provide a method of forming an anti-fuse module on a smaller design rule.

A further object of the present invention is to provide a method of forming an anti-fuse module while protecting the via portion of the normal device.

Other objects will appear hereinafter.

It has now been discovered that the above and other objects of the present invention may be accomplished in the following manner. Specifically, a semiconductor structure having at least two exposed metal lines covered by a first dielectric layer is provided. A first metal line is within an anti-fuse area and a second metal line is within an interconnect area. A first metal via is formed within the first dielectric layer within the anti-fuse area with the first metal via contacting the first metal line. A SiN layer is deposited over the first dielectric layer and the first metal via. The SiN layer is patterned to form at least two openings. A first opening exposes the first metal via, and a second opening exposes a portion of the first dielectric layer above the second metal line. A fusing element layer is deposited and patterned over the patterned SiN layered structure to form a fusing element over the first metal via. Simultaneously, an anti-fuse metal line is formed over the fusing element to form an anti-fuse module within the anti-fuse area, and a dual damascene interconnect is formed over, and contacting with, the second metal line and within the interconnect area.

BRIEF DESCRIPTION OF THE DRAWINGS

The features and advantages of the method of fabricating an anti-fuse module integrated with a dual damascene process according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
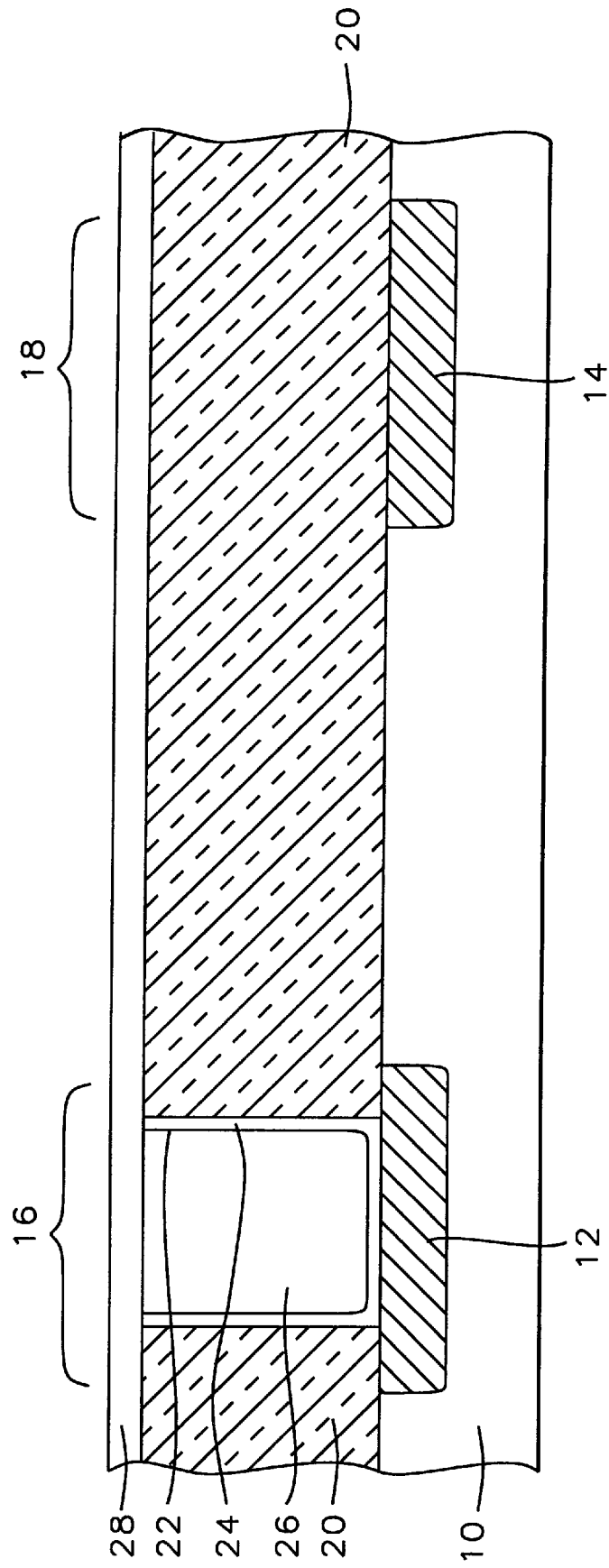
FIGS. 1 through 4 schematically illustrate in cross-sectional representation a preferred embodiment of the present invention.

Accordingly as shown in FIG. 1, starting semiconductor structure 10 includes two exposed metal lines 12, 14 and is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface.

The term "semiconductor structure" is meant to include devices formed within a semiconductor wafer and the layers overlying the wafer. Unless otherwise specified, all structures, layers, etc. may be formed or accomplished by conventional methods known in the prior art.

First dielectric layer 20 is deposited over semiconductor structure 10 and is patterned to form trench 22 from about 6000 to 8000 Å deep. First dielectric layer 20 may comprise a low-k (low dielectric constant) material or other oxide material.

Barrier layer 24 may be formed, lining trench 22. A planarized, first metal via 26 is formed in trench 22, filling trench 22, over barrier layer 24. First metal via 26 defines the bottom contact of the anti-fuse module to be formed within anti-fuse area 16 and may comprise tungsten (W), aluminum (Al) or copper (Cu). Barrier layer 24 may comprise an appropriate material for the selected metal used to form first metal via 26. Second metal line 14 is within interconnect area 18.

A layer 28, preferably silicon nitride (SiN), is deposited over first dielectric layer 20 and first metal via 26. Layer 28 is from about 500 to 1000 Å thick and may also comprise two layers of SiN and oxide, or three layers of oxide, SiN, then oxide.

Figure 2:
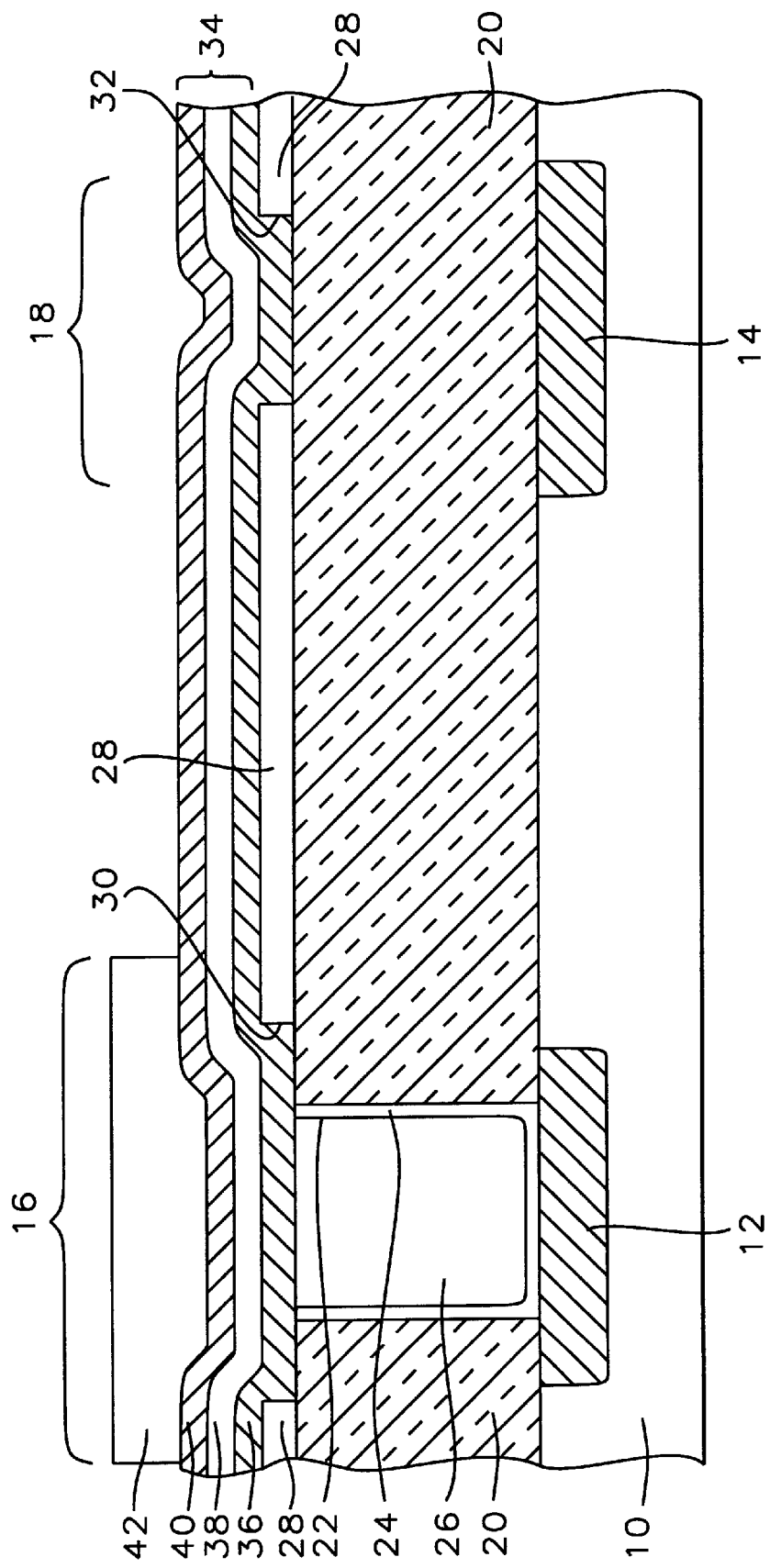

As shown in FIG. 2, SiN layer 28 is patterned to form openings 30, 32 over first metal via 26 within anti-fuse area 16 and over first dielectric layer 20 within interconnect area 18 and over second metal line 14, respectively. Opening 30 exposes, and preferably extends beyond, first metal via 26. Opening 32 exposes a portion of first dielectric layer 20 and preferably does not extend beyond underlying second metal line 14.

Fusing element layer 34 is formed over the structure, covering patterned SiN layer 28 and filling openings 30, 32. Fusing element layer 34 is from about 1000 to 2000 Å thick and preferably comprises alternating layers of tantalum nitride (TaN) 36/amorphous silicon (a-Si) 38/TaN 40 but may comprise other alternating layers of materials, such as TaN/oxide/TaN, TiN/amorphous-Si/TiN, or TiN/oxide/TiN.

Fuse mask 42 is formed over the portion of fusing element layer 34 within anti-fuse area 16. Fuse mask 42 is preferably comprised of photoresist.

Figure 3:
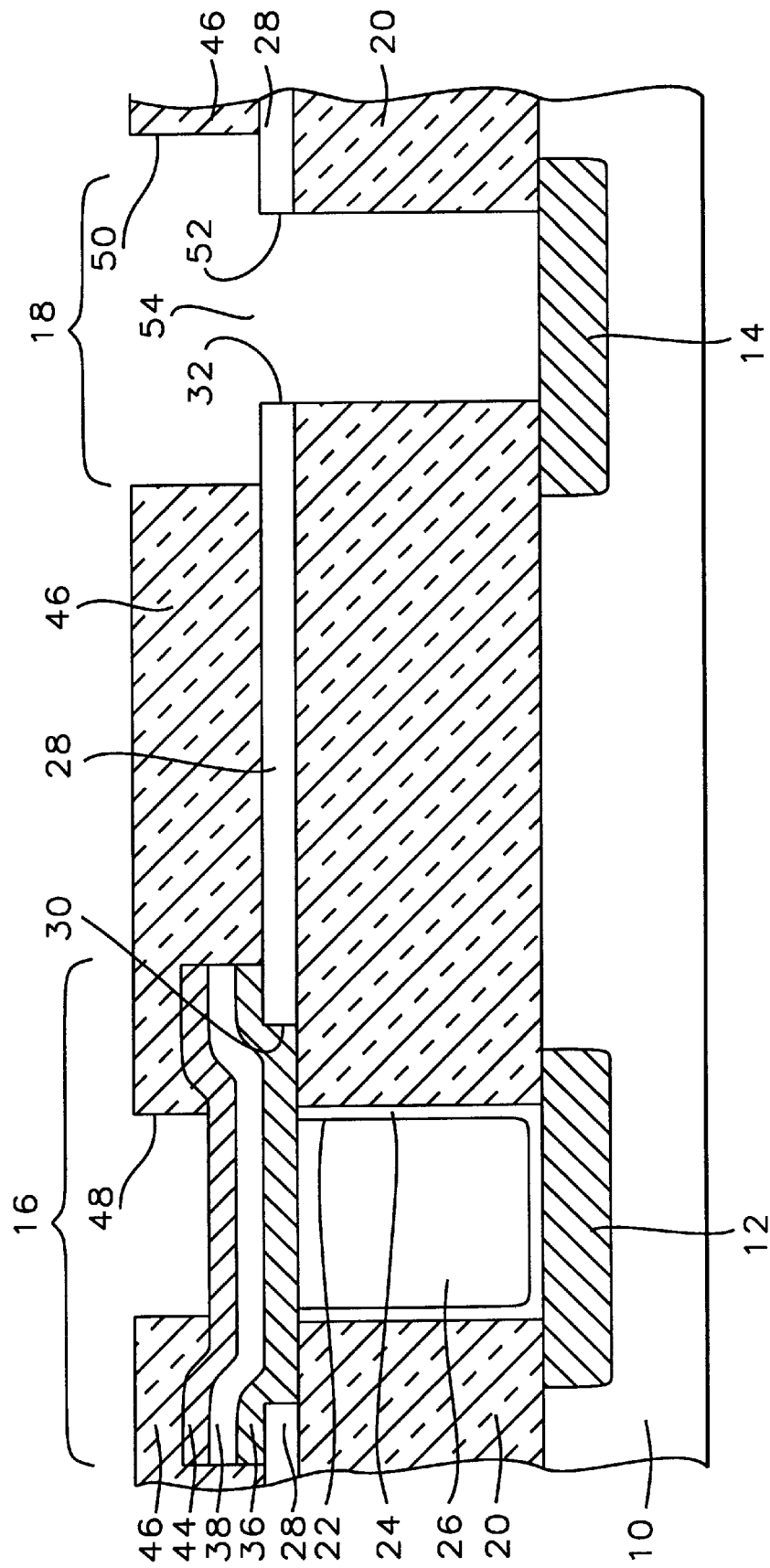

As shown in FIG. 3, the unmasked fusing element layer 34 is removed leaving fusing element 44 under fuse mask 42. Fuse mask 42 is then removed.

Second dielectric layer 46 is deposited over the structure. Second dielectric layer 46 and part of first dielectric layer 20 are then patterned to form the following openings. Anti-fuse metal line opening 48 is from about 3000 to 7000 Å deep and is formed over fusing element 44 within second dielectric layer 46. Upper dual damascene metal line opening 50 is from about 4000 to 8000 Å deep and is formed over, and extends beyond, opening 32 in patterned SiN layer 28. Lower dual damascene via opening 52 is from about 6500 to 9000 Å deep and is formed within first dielectric layer 20, and includes opening 32 within patterned SiN layer 28, over second metal line 14. Via opening 52 and metal line opening 50 form dual damascene opening 54.

Figure 4:
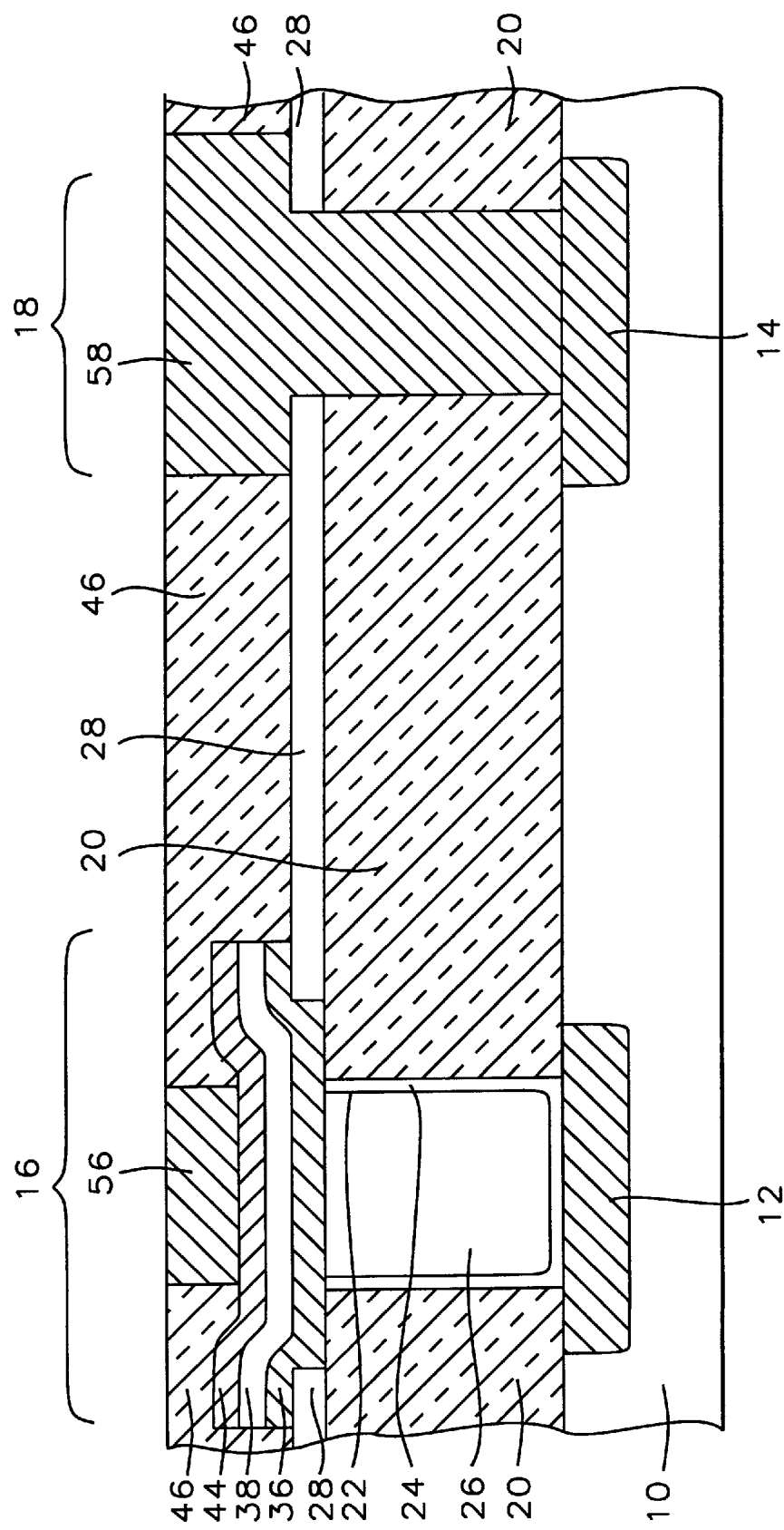

FIG. 4 shows the results of a dual damascene process. A metal layer (not shown), preferably comprised of copper (Cu), is deposited over the structure shown in FIG. 3 at least as high as the upper surface of patterned second dielectric layer 46. The Cu layer fills anti-fuse metal line opening 48 over fusing element 44, and fills dual damascene opening 54 over second metal line 14.

The Cu layer is then planarized to remove the excess Cu and forms anti-fuse Cu metal line 56, completing the anti-fuse module within anti-fuse area 16, and forms dual Cu damascene interconnect 58 within interconnect area 18. Anti-fuse metal line 56 contacts fusing element 44 and dual damascene interconnect 58 contacts second metal line 14.

When/if desired, fusing element 44 can be ruptured, or converted to a lower resistance layer, via a high voltage electrical pulse through anti-fuse metal line 56 thereby permitting an electrical connection between anti-fuse metal line 56 and first metal line 12 through first metal via 26, thus activating or connecting the underlying device(s) connected through first metal line 12.

The process of forming the anti-fuse module of the present invention may thus be used with a dual damascene process without damaging the via portion of the dual damascene interconnect structure. In contrast, the normal oxide-CMP (chemical mechanical polishing) and tungsten (W)-CMP process open fuse via and normal via together. When an anti-fuse structure is built on the fuse via, many etching and cleaning steps are required for the fuse and will affect the normal fuse surface. This is especially true for cleaning solvents that attack the normal via barrier metal which causes higher via resistance and via missing problem.

The process of the present invention also permits formation of anti-fuse modules on a smaller design rule because a dual damascene process provides a very advanced design for local interconnections.

While particular embodiments of the present invention have been illustrated and described, it is not intended to limit the invention, except as defined by the following claims.

We claim:

1. A method of fabricating an anti-fuse module and dual damascene interconnect structure, the steps comprising:

providing a semiconductor structure having at least two exposed metal lines covered by a first dielectric layer; a first metal line is within an anti-fuse area and a second metal line is within an interconnect area;

forming a first metal via within said first dielectric layer within said anti-fuse area, said first metal via contacting said first metal line;

depositing a SiN layer over said first dielectric layer and said first metal via;

patterning said SiN layer to form at least two openings; a first opening exposes said first metal via, and a second opening exposes a portion of said first dielectric layer above said second metal line;

depositing and patterning a fusing element layer over said patterned SiN layered structure to form a fusing element over said first metal via; and simultaneously forming: an anti-fuse metal line over said fusing element to form an anti-fuse module within said anti-fuse area; and a dual damascene interconnect over, and contacting with, said second metal line and within said interconnect area.

2. The method of claim 1, wherein said first metal via is comprised of a metal selected from the group of tungsten, aluminum, and copper.

3. The method of claim 1, wherein said first dielectric layer is comprised of a low dielectric constant material.

4. The method of claim 1, wherein said fusing element layer and said fusing element comprise a lower layer of tantalum nitride, a middle layer of amorphous silicon, and an upper layer of tantalum nitride.

5. The method of claim 1, wherein said anti-fuse metal line and said dual damascene interconnect is formed from copper.

6. A method of fabricating an anti-fuse module and dual damascene interconnect structure, the steps comprising:

providing a semiconductor structure having at least two exposed metal lines with an anti-fuse area over a first said metal line and an interconnect area over a second said metal line;

forming a planarized, first metal via within a first dielectric layer overlying said semiconductor structure within said anti-fuse area, said first metal via contacting said first metal line;

depositing a SiN layer over said first dielectric layer and said first metal via;

patterning said SiN layer exposing said first metal via, and exposing a portion of first dielectric layer above said second metal line and within said interconnect area;

depositing a fusing element layer over said patterned SiN layered structure;

forming a fuse mask over said fusing element layer within said anti-fuse area and above said first metal via and said first metal line;

etching and removing said unmasked fusing element layer forming a fusing element under said fuse mask;

removing said fuse mask;

depositing and patterning a second dielectric layer over said structure to form an anti-fuse metal line opening over said fusing element, and an upper dual damascene metal line opening over said exposed portion of said first dielectric layer above said second metal line and exposing the portion of said SiN layer within said interconnect area;

patterning said exposed portion of said first dielectric layer above said second metal line to form a lower dual damascene via opening exposing said second metal line; where said upper dual damascene metal line opening and said lower dual damascene via opening form a dual damascene opening over said second metal line;

depositing a metal layer over said structure, at least as high as the upper surface of said second dielectric layer, filling said anti-fuse metal line opening and said dual damascene opening; and planarizing said metal layer to remove the excess of said metal layer to form: an anti-fuse metal line within said anti-fuse metal line opening to form an anti-fuse module; and a dual damascene interconnect structure within said dual damascene opening.

7. The method of claim 6, wherein said first metal via is comprised of a metal selected from the group of tungsten, aluminum, and copper.

8. The method of claim 6, wherein said first and second dielectric layers are comprised of a low dielectric constant material.

9. The method of claim 6, wherein said fusing element layer and said fusing element comprise a lower layer of tantalum nitride, a middle layer of amorphous silicon, and an upper layer of tantalum nitride.

10. The method of claim 6, wherein said anti-fuse metal line and said dual damascene interconnect is formed from copper.

11. A method of fabricating an anti-fuse structure and dual damascene structure, the steps comprising:

providing a semiconductor structure having at least two exposed metal lines with an anti-fuse area over a first said metal line and an interconnect area over a second said metal line;

depositing and patterning a layer of low-k dielectric material over said semiconductor structure to form a trench above said first metal line and within said anti-fuse area;

forming a planarized, first metal via within said anti-fuse area trench; said metal via being comprised of a metal selected from the group of tungsten, aluminum, and copper;

forming a layer of SiN over said low-k dielectric layer;

patterning said SiN layer exposing said planarized anti-fuse area metal via, and exposing said low-k dielectric layer above a portion of said second metal line and within said interconnect area;

forming a fusing element layer over said patterned SiN layered structure;

forming a fuse mask over said fusing element layer above, and extending a predetermined amount beyond, said anti-fuse area metal via and said first metal line;

etching and removing said unmasked fusing element layer leaving a remaining portion of said fusing element layer under said fuse mask;

removing said fuse mask;

depositing and patterning a second dielectric layer over said structure to form an anti-fuse metal line opening over said fusing element, and an upper dual damascene metal line opening over said exposed portion of said first dielectric layer above said second metal line and exposing the portion of said SiN layer within said interconnect area;

patterning said exposed portion of said first dielectric layer above said second metal line to form a lower dual damascene via opening exposing said second metal line; where said upper dual damascene metal line opening and said lower dual damascene via opening form a dual damascene opening over said second metal line;

depositing a copper metal layer over said structure filling said first opening and said dual damascene opening at least as high as said low-k intermetal dielectric layer; and planarizing said metal layer to remove the excess of said copper metal layer; whereby an anti-fuse module is formed over said anti-fuse area metal via over first metal line and a dual copper damascene interconnect structure is formed over said second metal line.

12. The method of claim 11, wherein said fusing element layer and said fusing element comprise a lower layer of tantalum nitride, a middle layer of amorphous silicon, and an upper layer of tantalum nitride.

13. The method of claim 11, wherein said anti-fuse module includes a planarized anti-fuse copper metal line within said anti-fuse metal line opening.

* * * * *